US006069445A

United States Patent [19]

Smith

[11] Patent Number: 6,069,445

[45] Date of Patent: May 30, 2000

[54] HAVING AN ELECTRICAL CONTACT ON AN EMISSION SURFACE THEREOF

[75] Inventor: Arlynn W. Smith, Blue Ridge, Va.

[73] Assignee: ITT Industries, Inc., White Plains, N.Y.

[21] Appl. No.: 08/791,365

[22] Filed: Jan. 30, 1997

[51] Int. Cl.[7] .............................. H01J 43/12; H01L 29/06

[52] U.S. Cl. .......................... 313/541; 313/542; 313/523; 250/214 VT; 257/11

[58] Field of Search ..................................... 313/544, 543, 313/542, 541, 539, 530, 534, 526, 525, 524, 523, 103 CM; 250/214 VT

[56] References Cited

U.S. PATENT DOCUMENTS

| | | | |
|---|---|---|---|
| 4,961,025 | 10/1990 | Thomas et al. | 427/67 |
| 4,999,211 | 3/1991 | Duggan | 427/8 |
| 5,114,373 | 5/1992 | Peckman | 445/3 |
| 5,298,831 | 3/1994 | Amith | 313/373 |
| 5,314,363 | 5/1994 | Murray | 445/14 |
| 5,336,902 | 8/1994 | Nigaki et al. | 313/542 |
| 5,360,630 | 11/1994 | Thomas et al. | 313/524 |
| 5,402,034 | 3/1995 | Blouch et al. | 313/370 |
| 5,712,490 | 1/1998 | Smith | 313/542 |
| 5,733,827 | 3/1998 | Tehrani et al. | 438/572 |

*Primary Examiner*—Nimeshkumar D. Patel
*Assistant Examiner*—Joseph Williams
*Attorney, Agent, or Firm*—McDermott, Will & Emery

[57] ABSTRACT

A photocathode device for use in an image intensifier of a night vision device, the device having a faceplate fabricated from an optically transparent material and a photoemissive semiconductor wafer bonded to the faceplate. The photoemissive wafer includes a first contact disposed on a peripheral surface thereof for electrically contacting the wafer and an annular-shaped second contact disposed on the emission surface of the wafer for enabing a potential difference to be applied across the wafer to facilitate the emission of photogenerated carriers from the emission surface.

20 Claims, 2 Drawing Sheets

HAVING AN ELECTRICAL CONTACT ON AN EMISSION SURFACE THEREOF

FIELD OF THE INVENTION

The present invention relates generally to cathode devices and more particularly to a photocathode device having a contact on the emission surface thereof which enables a small potential to be applied across the bulk of the photocathode device to enhance the emission of photogenerated carriers.

BACKGROUND OF THE INVENTION

Photocathode devices are optoelectronic detectors which use the photoemissive effect to detect light energy. Thus, when photons impinge the surface of a photocathode device, the impinging photons cause electrons to be emitted therefrom. Many photocathode devices are made from semiconductor materials such as gallium arsenide (GaAs) which exhibit the photoemissive effect. While GaAs is preferred, it is noted that other III–V materials can be used such as GaP, GaInAsP, InAsP and so on. In a semiconductor photocathode device, photons are absorbed by a photoemissive semiconductor material. The absorbed photons cause the carrier density of the semiconductor material to increase, thereby causing the material to generate a photocurrent.

Semiconductor photocathode structures are employed in the image intensifiers of state of the art night vision devices. These photocathode structures typically use a semiconductor epilayer for the photon absorbing material. The semiconductor epilayer is thermally and mechanically bonded to a glass face plate of the image intensifier to provide a rigid, vacuum supporting tube structure. The peripheral surface of both the semiconductor epilayer and the glass face plate are coated with a conducting material to provide an electrical contact to the photocathode semiconductor structure. No additional contacts to the photocathode structure are provided. The image intensifier generates a photocurrent when photons are absorbed by the semiconductor epilayer, which results in the generation of carriers within the bulk of the epilayer. The carriers, without the influence of an electrostatic field applied at the contact, diffuse to the emission surface of the epilayer where a threshold energy or barrier exists. The carriers are emitted into the vacuum within the tube structure if the energy of the carriers is sufficient to either surmount the barrier or tunnel through the barrier at the emission surface. The carriers which make it through the barrier are emitted by the semiconductor photocathode and are accelerated and/or amplified by subsequent tube components to generate an intensified output image.

In order for the carriers to maintain a high enough energy to surmount or tunnel through the barrier as they diffuse to the emission surface, many present semiconductor photocathode designs utilize heavily doped semiconductor materials. The heavy doping is made uniform over the entire active depth of the photocathode. Other present semiconductor photocathode designs use a heavily doped semiconductor region near the glass plate and a lower doped region near the emission surface. The heavy doping in both designs limit the distance over which conduction band bending takes place since the lower doped concentration of the high/low doped design is essentially the same as the doping concentration used in the uniform heavily doped design described earlier. Conduction band bending over a long distance leads to the carriers losing energy and not being emitted to the vacuum. More specifically, the use of a highly doped semiconductor material in present photocathode designs provide a very small space charge region to excite the carriers over a very small distance. The heavy doping also severely limits carrier diffusion lengths, therefore, limiting the cathode thickness which ultimately limits the amount of photons which can be absorb by the semiconductor material, which in turn, limits the photogeneration capabilities of the photocathode structure.

The uniformly high or high/low doping of the semiconductor material in conjunction with the single contact to the photocathode structure, does not allow the carriers to be excited which would substantially improve the probability for emission into the vacuum.

Accordingly, there is a need for a semiconductor photocathode structure that substantially overcomes the problem of carrier emission.

SUMMARY OF THE INVENTION

A cathode device for use in an image intensifier, comprising a photoemissive semiconductor wafer having a peripheral surface and a substantially planar emission surface; first contact means disposed on the peripheral surface of the wafer for electrically contacting the wafer; and second contact mean disposed on the emission surface for enabling a potential difference to be applied across the wafer to facilitate the emission of photogenerated carriers from the emission surface.

In one embodimient of the present invention, the photoemissive wafer is bonded to a faceplate of optically transparent material, the faceplate forming a component of an image intensifer used in a night vision device.

BRIEF DESCRIPTION OF THE DRAWINGS

For a detailed understanding of the present invention, reference should be made to the following detailed description taken in conjunction with the accompanying drawings wherein.

DETAILED DESCRIPTION OF THE INVENTION

The field assisted photocathode device of the present invention substantially overcomes the problem of emission which is characteristic of present photocathode structures, by accelerating the photogenerated carriers through the bulk of the device via an applied electric field. This is accomplished in the present invention, by providing a second contact on the emission surface of the photocathode as will be explained below in more detail. The second contact allows a small potential to be applied across the bulk of the device.

Although the field assisted photocathode device of the present invention can be used in many different applications where optoelectronic detectors are required, the present invention is especially useful in image intensifiers found in state of the art night vision devices. Accordingly, the present invention will be described in conjunction with its use in an image intensifier of a night vision device.

Figure 1:
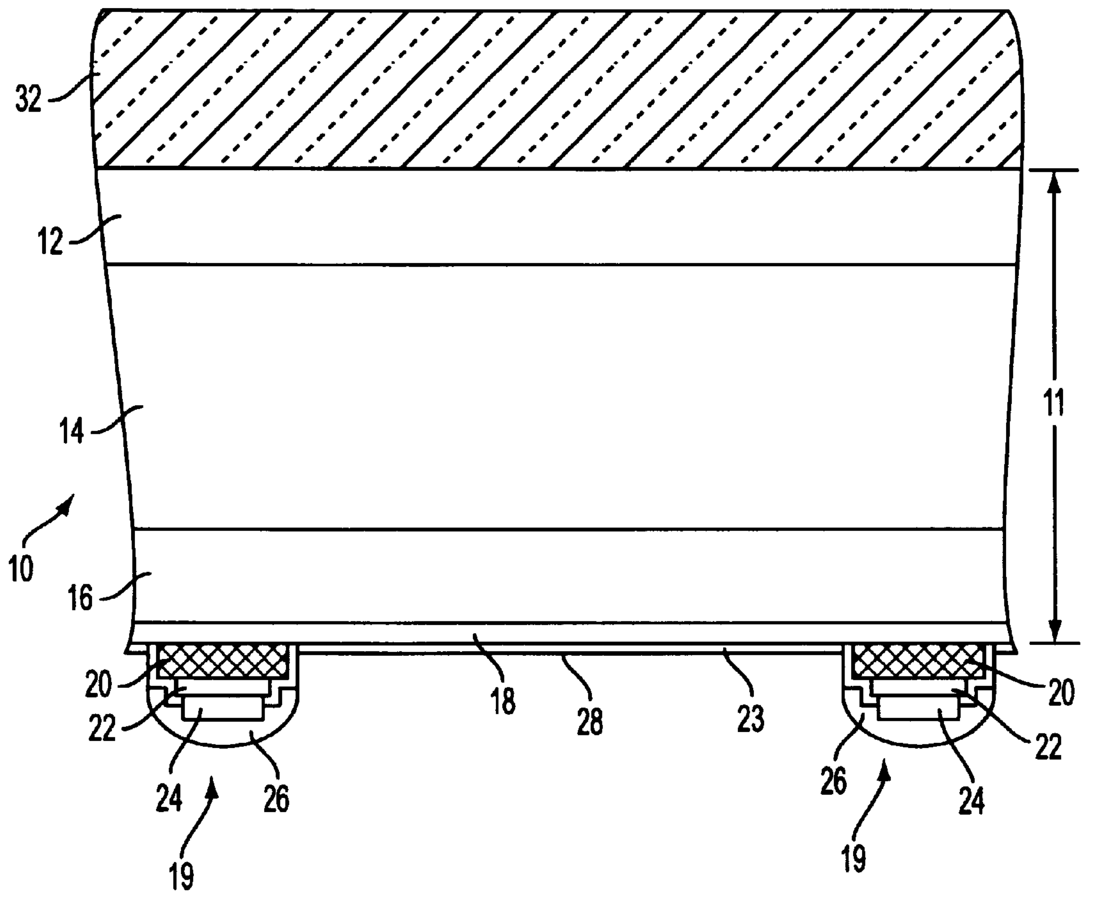
FIG. 1 is side cross-sectional view through a portion of the cathode device of the present invention.

Referring to FIG. 1, the field assisted photocathode device 10 of the present invention is shown bonded to a faceplate 32. The faceplate 32 is made from a high quality optical material such as glass. One such optical glass is manufactured by Corning under part number 7056. This glass comprises 70 percent silica ($SiO_2$), 17 percent boric oxide ($B_2O_3$), 8 percent potash ($K_2O$), 3 percent alumina ($Al_2O_3$), and 1 percent soda ($Na_2O$) and lithium oxide ($Li_2O$). It should be understood, that other glasses may be used.

Figure 3:
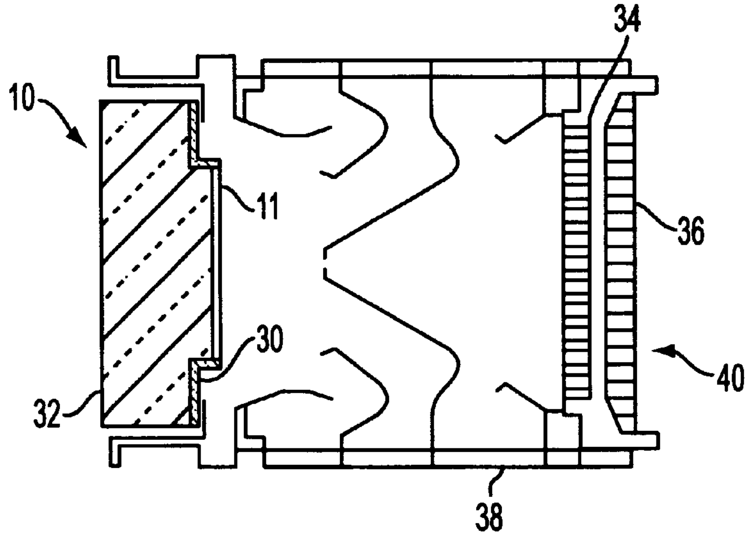
FIG. 3 is cross-sectional side view through an image intensifier which employs the cathode device of the present invention.

As shown in FIG. 3, the faceplate 32 is one of three main components of an image intensifier 40 that is used in a night vision device. The other two components of the image intensifier 40 of FIG. 3 include an electron amplifier such as a microchannel plate 34 (MCP), and a phosphor screen 36 (anode). The faceplate 32 is generally designed to minimize light scatter and stray light in the image intensifier as discussed in U.S. Pat. No. 4,961,025 entitled CATHODE FOR IMAGE INTENSIFIER TUBE HAVING REDUCED VEILNG GLARE issued on Oct. 2, 1990 to Thomas et al. and assigned to ITT Corporation, the assignee herein. The faceplate 32, MCP 34 and phosphor screen 36 are assembled to an evacuated housing 38 using techniques such as those described in U.S. Pat. No. 4,999,211 entitled APPARATUS AND METHOD FOR MAKING A PHOTOCATHODE issued on Mar. 12, 1991 to Duggan, and U.S. Pat. No. 5,314,363 entitled AUTOMATED SYSTEM AND METHOD FOR ASSEMBLING IMAGE INTENSIFIER TUBES issued on May 24, 1994 to Murray, both of which are assigned to ITT Corporation, the assignee herein.

Referring again to FIG. 1, the photocathode device 10 comprises a photoemissive wafer 11 which is fabricated in accordance with conventional well known techniques. The photoemissive wafer 11 is bonded to the faceplate 32 using well known techniques such as those taught in U.S. Pat. No. 5,298,831 entitled METHOD OF MAKING PHOTOCATHODES FOR IMAGE INTENSIFIER TUBES issued on Mar. 29, 1994 to Amith and assigned to ITT Corporation, the assignee herein. The pertinent sections of the U.S. Pat. No. 5,298,831 dealing with the bonding of a photoemissive wafer to a faceplate of an image intensifer are incorporated herein by reference.

The photoemissive wafer 11 used in the present invention includes an aluminum gallium arsenide (AlGaAs) window layer 12 which is bonded directly to the faceplate 32. The window layer 12 is followed by a gallium arsenide (GaAs) active or cathode layer 14 and a ramp layer 16, which progressively changes from GaAs to AlGaAs, covers the active layer 14. A GaAs buffer layer 18 is provided over the GaAs to AlGaAs ramp layer 16 and defines a surface 28 that operates as the emission surface of the photocathode device 10. The peripheral surfaces of the faceplate 32 and the photoemissive wafer 11 of photocathode 10 are coated with a conducting material 30 (FIGS. 2 and 3) such as chrome, to provide a first electrical contact to the photocathode device 10.

The bulk doping of the wafer 11 is generally very low as will be explained. In particular, the AlGaAs window layer 12 and the GaAs active layer 14 utilize a low doping concentration of between $1\times10^{17}$ $cm^{-3}$ and $5\times10^{17}$ $cm^{-3}$. The GaAs to AlGaAs ramp layer 16 utilizes a low doping concentration of approximately $5\times10^{16}$ $cm^{-3}$ and the GaAs buffer layer 18 is doped to a concentration of approximately $1\times10^{18}$ $cm^{-3}$.

Referring still to FIG. 1, the emission surface 28 of the wafer 11 includes a second contact 19 and an activating surface 23 of cesium/cesium oxide. The second contact 19 is comprised of annular-shaped rings of AlGaAs etch stop layer 20, which is disposed on the interior of the emission surface 28 of the wafer 11 and buffer layer 22 of GaAs. The etch stop layer 20 and buffer layer 22 are patterned using conventional lithography techniques and can be either undoped or lightly doped. A metal grid 24 is provided on the patterned GaAs buffer layer 22 to provide the small potential across the bulk of the device. The AlGaAs etch stop layer 20, the GaAs buffer layer 22, and the metal grid 24 which make up the second contact, are covered by a layer 26 of insulation material. The insulation layer 26 provides protection for the metal grid 24 during subsequent processing steps to reveal the emission surface 28. When the photocathode device 10 of the present invention is assembled in an image intensifier of a night vision device, the insulation layer 26 also operates to provide protection to the image intensifier's microchannel plate from electrostatic discharge produced by the metal grid 24 during operation of the photocathode device 10.

Figure 2:
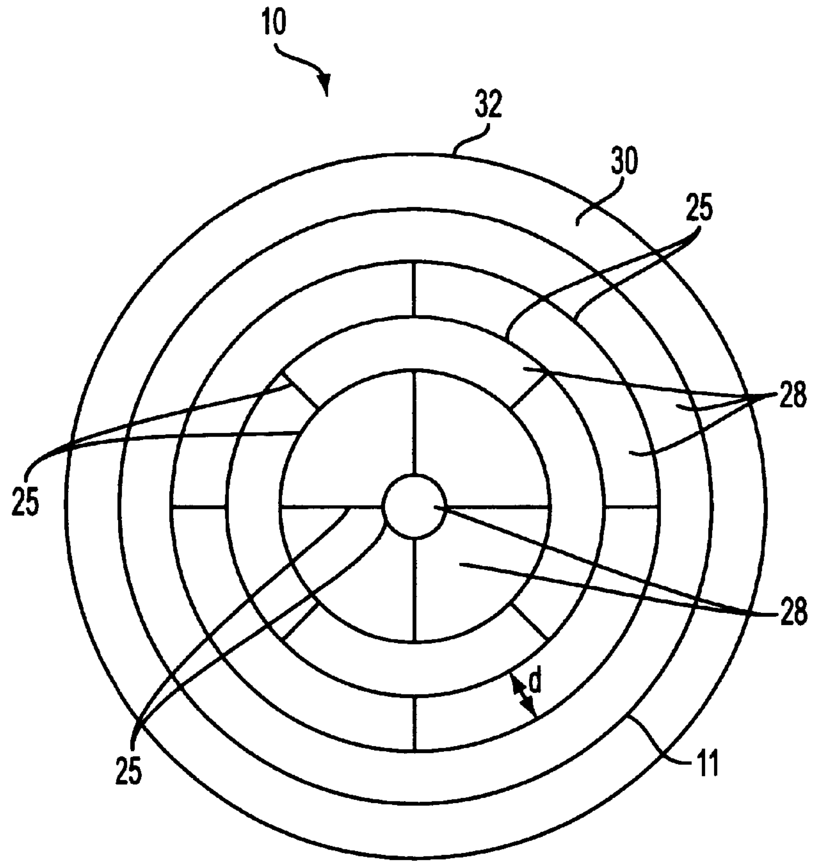
FIG. 2 is a bottom plan view of the cathode device of the present invention.

Referring to FIG. 2, a bottom plan view of the photocathode device prior to the formation of the insulation layer 26 is shown. In this view, the metal grid 24 is shown to consist of a plurality of spaced apart metallic lines 25. Each line 25 has a thickness of less than 1 $\mu$m and is spaced from an adjacently located line 25 by a distance d. The spacings between the metallic lines 25 designated by the distance d depend upon the diffusion length of the carriers. However, in most applications, the spacings are preferably between 10 and 100 $\mu$m. In any case, the metal grid 24 must shadow the smallest possible area of the emission surface 28 as shown in FIG. 2.

As discussed above, the bulk doping of the wafer 11 is set at a low level so that the field generated by the potential applied across the bulk of the wafer 11 is not dropped solely in the vicinity of the second contact 19. The photogenerated carriers are prevented from entering the second contact region by the large blocking barrier provided by leaving the etch stop layer 20 of AlGaAs in place. The energy barrier created by the etch stop layer 20 limits the dark current in the cathode to thermionic emission over the barrier. Accordingly, photogenerated carriers are now pushed towards the emission surface 28 by internal electric field created by the applying the small potential bias across the bulk of the wafer 11 via the second contact 19. If enough bias is applied the carriers will enter the space charge region near the emission surface 28 at a substantially higher energy than by diffusion alone. These excited carriers will have a much higher probability of being emitted to the vacuum by tnnneling through the vacuum barrier.

It will be understood that the embodiment described herein is merely exemplary and that a person skilled in the art may make many variations and modifications to the described embodiment utilizing functionally equivalent elements to those described. Any variations or modifications to the invention described hereinabove are intended to be included within the scope of the invention as defined by the appended claims.

What is claimed is:

1. A cathode device comprising:

a photoemissive semiconductor wafer having a peripheral surface extending between opposing first and second surfaces, one of said first and second surfaces forming a substantially planar emission surface;

a first electrical contact disposed on said peripheral surface of said wafer; and a second electrical contact disposed on said emission surface of said wafer;

wherein said first and second electrical contacts enable a potential difference to be applied across said wafer to facilitate the emission of photogenerated carriers from said emission surface.

2. The cathode device according to claim 1, wherein said photoemissive semiconductor wafer includes a window layer of semiconductive material.

3. The cathode device according to claim 2, wherein said photoemissive semiconductor wafer further includes an active layer of semiconductive material disposed on said window layer.

4. The cathode device according to claim 3, wherein said photoemissive semiconductor wafer further includes a ramp layer of semiconductive material disposed on said active layer.

5. The cathode device according to claim 4, wherein said photoemissive semiconductor wafer further includes a buffer layer of semiconductive material disposed on said ramp layer, said buffer layer defining said emission surface of said cathode device.

6. The cathode device according to claim 1, wherein said second electrical contact includes an annular-shaped etch stop layer of semiconductive material disposed on said emission surface.

7. The cathode device according to claim 6, wherein said second electrical contact further includes a buffer layer of semiconductive material disposed on said etch stop layer.

8. The cathode device according to claim 7, wherein said second electrical contact further includes a metal grid disposed on said buffer layer.

9. The cathode device according to claim 1, further comprising a layer of insulation disposed over said second electrical contact.

10. A cathode device for use in an image intensifier of a night vision device, comprising:

a faceplate fabricated from an optically transparent material;

a photoemissive semiconductor wafer bonded to said faceplate, said wafer having a peripheral surface extending between opposing first and second surfaces, one of said first and second surfaces forming a substantially planar emission surface;

a first contact disposed on said peripheral surface of said wafer; and second contact disposed on said emission surface of said wafer;

wherein said first and second electrical contacts enable a potential difference to be applied across said wafer to facilitate the emission of photogenerated carriers from said emission surface.

11. The cathode device according to claim 10, wherein said photoemissive semiconductor wafer includes:

a window layer of semiconductive material;

an active layer of semiconductive material disposed on said window layer;

a ramp layer of semiconductive material disposed on said active layer; and a buffer layer of semiconductive material disposed on said ramp layer, said buffer layer defining said emission surface of said cathode device.

12. The cathode device according to claim 11, wherein said window layer is comprised of aluminum gallium arsenide and said active layer is comprised of gallium arsenide, both said window layer and said active layer doped to a concentration level of between $1\times10^{17}$ $cm^{-3}$ and $5\times10^{17}$ $cm^{-3}$.

13. The cathode device according to claim 11, wherein said ramp layer is comprised of gallium arsenide which progressively changes to aluminum gallium arsenide, said ramp layer doped to a concentration level of approximately $5\times10^{16}$ $cm^{-3}$ .

14. The cathode device according to claim 11, wherein said buffer layer is comprised of gallium arsenide doped to a concentration level of approximately $1\times10^{18}$ $cm^{-3}$.

15. The cathode device according to claim 10, wherein said second electrical contact includes an annular-shaped etch stop layer of semiconductive material disposed on said emission surface.

16. The cathode device according to claim 15, wherein said second electrical contact further includes a buffer layer of semiconductive material disposed on said etch stop layer.

17. The cathode device according to claim 16, wherein said second electrical contact further includes a metal grid disposed on said buffer layer.

18. The cathode device according to claim 10, further comprising a layer of insulation disposed over said second electrical contact.

19. A photocathode device for use in an image intensifier of a night vision device, comprising:

a faceplate fabricated from an optically transparent material;

a photoemissive semiconductor wafer bonded to said faceplate, said wafer having a peripheral surface extending between opposing first and second surfaces, one of said first and second surfaces forming a substantially planar emission surface;

a first electrical contact disposed on said peripheral surface of said wafer; and an annular-shaped second electrical contact disposed on said emission surface of said wafer;

wherein said first and second electrical contacts enable a potential difference to be applied across said wafer to facilitate the emission of photogenerated carriers from said emission surface.

20. The photocathode device according to claim 19, wherein said photoemissive semiconductor wafer includes an active layer gallium arsenide doped to a concentration level of between $1\times10^{17}$ $cm^{-3}$ and $5\times10^{17}$ $cm^{-3}$.

* * * * *